(12) United States Patent
Riley, Jr.

(10) Patent No.: US 6,495,765 B2
(45) Date of Patent: Dec. 17, 2002

(54) SUPERCONDUCTORS

(75) Inventor: Gilbert N. Riley, Jr., Marlborough, MA (US)

(73) Assignee: American Superconductor Corporation, Westborough, MA (US)

( * ) Notice: Subject to any disclaimer, the term of this patent is extended or adjusted under 35 U.S.C. 154(b) by 0 days.

(21) Appl. No.: 09/797,487

(22) Filed: Mar. 1, 2001

(65) Prior Publication Data

US 2001/0009888 A1 Jul. 26, 2001

Related U.S. Application Data

(62) Division of application No. 08/902,207, filed on Jul. 29, 1997, now Pat. No. 6,218,340, which is a continuation of application No. 08/462,130, filed on Jun. 5, 1995, now abandoned, which is a continuation of application No. 08/402,420, filed on Mar. 10, 1995, now abandoned, which is a continuation of application No. 08/261,928, filed on Jun. 17, 1994, now abandoned, which is a continuation of application No. 07/906,843, filed on Jun. 30, 1992, now abandoned.

(51) Int. Cl.$^7$ .............................................. H01B 12/00
(52) U.S. Cl. ........................ 174/125.1; 29/599; 505/431
(58) Field of Search .............................. 174/15.4, 125.1; 505/813, 704, 431, 231, 430, 739, 740; 148/96; 29/599

(56) References Cited

U.S. PATENT DOCUMENTS

| | | | | |
|---|---|---|---|---|
| 4,411,959 A | * | 10/1983 | Braginski et al. | 174/125.1 |
| 5,223,348 A | * | 6/1993 | Wong et al. | 148/96 |
| 5,319,843 A | * | 6/1994 | Iversen et al. | 29/599 |
| 6,194,352 B1 | * | 2/2001 | Riley et al. | 174/125.1 |
| 6,218,340 B1 | * | 4/2001 | Riley | 505/432 |
| 6,305,069 B1 | * | 10/2001 | Fujikami et al. | 29/599 |

* cited by examiner

Primary Examiner—Albert W. Paladini
(74) Attorney, Agent, or Firm—Hale and Dorr LLP

(57) ABSTRACT

A modified powder-in-tube process produces a superconductor wire having a significantly greater current density than will a superconductor wire of the same nominal superconductor composition produced using conventional draw-swage-extrude-roll deformation. In the process disclosed, a superconductor precursor is placed within a ductile tube, the tube with the powder therein is then deformed into a cross-section substantially corresponding to that of the end product, and the deformed tube is then subject to a plurality of heat treatments to convert the precursor into the desired superconducting ceramic oxide phase. Before the last of the heat treatments, the tube is isostatically pressed to densify and texture the superconductor precursor oxide in the tube.

6 Claims, 2 Drawing Sheets

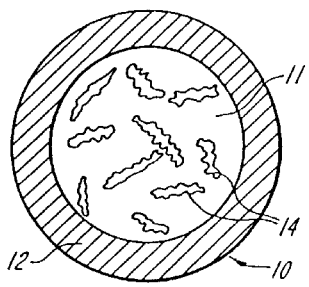
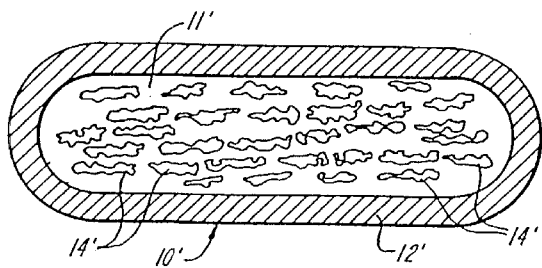
FIG. 1  FIG. 2
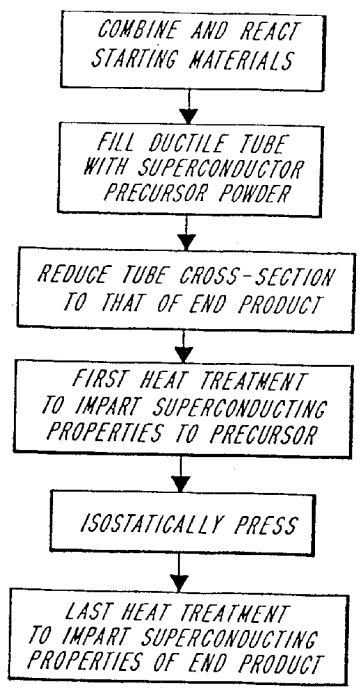
FIG. 3
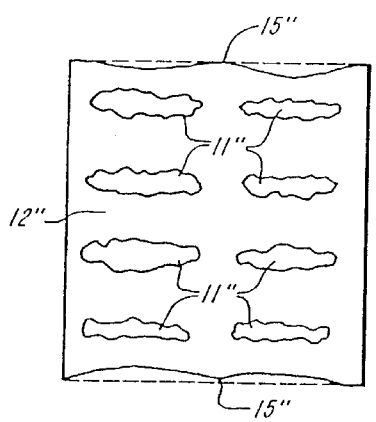
FIG. 4

SUPERCONDUCTORS

CROSS-REFERENCE TO RELATED APPLICATION

This application is a divisional of U.S. patent application Ser. No. 08/902,207, filed Jul. 29, 1997 now U.S. Pat. No. 6,218,340, which is a continuation of 08/462,130 filed Jun. 5, 1995 (abandoned), which is a continuation of 08/402,420 filed Mar. 10, 1995 (abandoned), which is a continuation of 08/261,928 filed Jun. 17, 1994 (abandoned), which is a continuation of 07/906,843 filed Jun. 30, 1992 (abandoned).

FIELD OF THE INVENTION

This invention relates to superconductors and, more particularly, to a process for improving the superconducting characteristics of oxide superconductors.

BACKGROUND OF INVENTION

The discovery, in 1986, of superconductivity in lanthanum barium copper oxide stimulated worldwide activity directed towards oxide superconductors having a high critical temperature ($T_c$). Since then, a significant number of other ceramic oxide superconductive materials have been discovered, including ceramic oxide compositions based on the Y—Ba—Cu—O, Bi—Sr—Ca—Cu—O and Tl—Ca—Ba—Cu systems. A number of now-issued U.S. Patents have proposed making superconducting wires from such materials using a process which includes the steps of filling a ductile metal tube with a powder of superconductor material or precursor, drawing or extruding the filled tube to reduce the tube diameter and provide a wire of predetermined diameter having a core of superconducting material or precursor and a surrounding metal sheath, and heat treating the wire to provide the desired superconducting properties in the core. The general process, commonly known as Powder-In-Tube or "PIT", is described in, for example, U.S. Pat. Nos. 4,952,554 to Jin et al., 4,980,964 to Boeke, and 5,043,320 to Meyer et al. According to the PIT processes taught in the aforementioned patents, the superconducting powder in the tube may be either a mixture of powders of the oxide components of the superconducting composition, or a powder having the nominal composition of the superconductor. U.S. Pat. No. 4,826,808 to Yurek et al., teaches forming a ceramic superconducting oxide by oxidation of a metal alloy precursor that has the same metal content as the desired superconducting oxide.

In the manufacture of superconducting wires using the general PIT procedure described above, and regardless of the nature of the particular powder initially placed in the ductile metal tube, the superconducting wire core of the final product should be textured uniformly, that is, the grains of the oxide superconductor, which are typically anisotropic and plate-like in shape, should be oriented in generally parallel, closely-stacked planes rather than at random angular orientations. A high degree of uniform texture effectively insures that the superconducting core is of high density and low porosity along its entire length.

In practice, this has proved difficult to achieve. In the course of manufacture, the wire typically undergoes a number of deformations (e.g, it is extruded, swaged, drawn or rolled), each of which may adversely affect texturing and density, and also may degrade (or even completely destroy) the superconducting properties of the ceramic oxide. The wire also often undergoes a plurality of successive heat-treatments, each typically following a deformation step. Thus, it is necessary both to deform and to heat the wire tape to achieve a desired shape and performance level; and if any step in the thermo-mechanical process is performed incorrectly (e.g., over-deformation or macro-crack initiation), the microstructure of the ceramic will not be as textured and dense as desired, and the properties will not be at an optimum. Moveover, even when done correctly, it has been found one effect of heat-treating after densification is often somewhat to reduce the texture and density of the superconducting material. This phenomenon, sometimes referred to as retrogade sintering, is not limited to high temperature ceramic superconductors and typically requires that the material again be compacted before being further heat treated.

In the case of high temperature ceramic superconducting materials, superconducting properties are imparted to the core of the end product by a final heat treatment, conducted after a final deformation and physical densification. However, the critical current density ($J_c$) of wires that have been formed and densified by extruding, drawing, rolling or swaging is less than desired for many applications.

There remains a need for a process, particularly one that is practical for use in the manufacture of wires or other conductors of significant length, that will provide superconductors of greater critical current density.

SUMMARY OF INVENTION

The present invention provides a PIT process, applicable to a wide range of ceramic oxide superconductor compositions, which will produce a superconductor wire or tape having a significantly greater current density than will a conductor of the same nominal superconductor composition produced using conventional draw-swage-extrude-roll deformation. In PIT processes for making wire, a superconductor precursor is placed within a ductile tube, the tube with the powder therein is then deformed to reduce its diameter and/or change its cross-sectional configuration, to produce substantially the desired form, and the deformed tube is then subjected to a plurality of heat treatments to convert the precursor into the desired superconducting ceramic oxide phase. According to the present invention, the deformed tube is isostatically pressed to texture and densify the superconductor material therein after the tube has been drawn or otherwise deformed to provide a conductor having substantially the desired diameter or cross-section of the end product, and before the last heat treatment. In preferred practices of the invention, a multi-filamentary structure including a plurality of noncircular filamentary cores of superconductor precursor material within a ductile matrix is formed, and the multi-filamentary structure is isostatically pressed after all but the last heat treatment, and is thereafter heat treated a final time.

In another aspect, the invention provides a procedure that is useful with any product including an anisotropic, aspected ceramic in a ductile metal sheath in which the desired ceramic properties are produced by successive densification and heat-treating steps and in which the ceramic is subject to the phenomenon of retrograde sintering. In the manufacture of such products, the invention features isostatically pressing the product to densify and texture the ceramic after the product has been formed into a substantially final configuration in which the ceramic is non-circular in cross-section, and after all but the last heat-treating step. The last heat-treatment may be performed after or simultaneously with the isostatic pressing.

DRAWINGS

FIGS. 1 and 2 are cross-sectional, somewhat schematic, views of monofilamentary wires at initial stages of a process of the present invention.

FIG. 3 is a flow diagram of a process of the present invention.

FIG. 4 is a cross-section of another conductor made using the present invention.

Figure 6A:
Figure 6B:
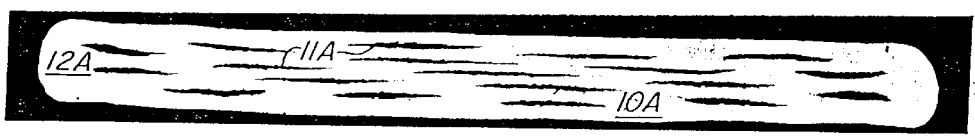
Figure 6C:
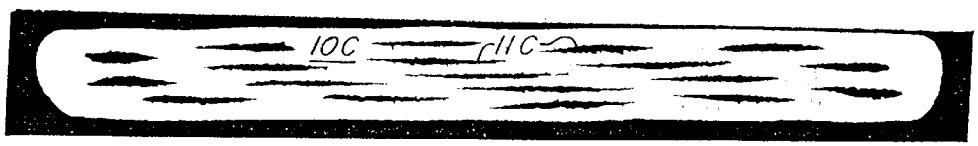

FIGS. 6A, 6B, and 6C are photomicrographs comparing a multifilimentary tape made according to the present invention with types constructed with other processing.

DESCRIPTION OF PREFERRED EMBODIMENTS

FIGS. 1 and 2 of the drawings schematically illustrate an exemplary monofilamentary wire, designated 10 in FIG. 1 and 10' in FIG. 2, in which 11 is the ceramic oxide superconductor filament and 12 is the ductile metal tube surrounding the filament. As indicated, the superconductor oxide filament comprises generally platelet-shaped grains 14. It will be noted that the overall cross-section of the filamentary core 11 of wire 10 of FIG. 1 is generally circular, and that the grains 14 of the ceramic superconducting core are randomly oriented at various angles to the axis of the wire. FIG. 2 illustrates a more desirable grain orientation; the grains 14' of the core of wire 10' are textured; that is, they are generally stacked, much like the bricks in a brick wall, in parallel planes extending generally parallel to the wire axis. It will also be noted that the cross-section of the core 11 of wire 10' is generally oblong or rectangular, rather than circular.

As previously indicated, one principal object of the present invention is to provide a process, suitable for use in the manufacture of superconducting wires and other conductors of useful length, in which the grains of the superconducting ceramic oxide core are textured, and in which the core is of relatively high density and low porosity.

In the preferred practice of the invention, this is accomplished using a variant of the PIT wire-making process. A relatively thick-walled piece of ductile metal tubing is closed off at one end, filled with a superconducting material precursor powder, and then sealed at the other end also. The tubing is made of a metal that, as taught in the aforementioned Yurek et al. patent, is chemically "noble" relative to the precursor; that is, the material chosen is one that will not oxidize under the conditions to which the tube and powder are subjected during processing. Preferred metals for the tube are gold and, more typically, silver.

As previously indicated, the present invention is useful with any ceramic oxide superconductor having a "platey", i.e., an aspected grain shape. According to the present invention, the tube 12 is filled with a powder of a superconductor precursor of the particular ceramic oxide superconductor chosen. As used in this specification, and in the appended claims, the term "superconductor precursor" means material(s) that, when subjected to the proper reactions and heat treatments, will react and form a continuous superconducting ceramic oxide phase. The particular reactions and heat treatments depend, of course, on the particular composition chosen and form no part of the present invention.

In the preferred practice of this invention, and as indicated in the flow diagram of FIG. 3, the starting materials for the chosen ceramic oxide superconductor are combined in the proper stoichiometric amounts and are reacted to form a complex ceramic oxide powder having the same nominal composition as the superconductor. For example, bismuth oxide, strontium oxide, calcium oxide and copper oxide are measured, mixed and reacted when a Bi—Sr—Ca—Cu—O ceramic superconductor is to be formed; and oxides of yttrium, barium and copper are employed when the desired superconductor is of the Y—Ba—Cu—O system. Alternatively, an alloy containing the metal components of the desired ceramic oxide superconductor may be formed and then oxidized. In either event the superconductor precursor formed at this stage is an oxide, usually in the form of an oxide powder without the need for mechanical reduction to powder, having the same nominal chemical composition as the desired end-product superconductor. However, the oxide does not actually have to be superconducting since these desired superconducting properties will be obtained during later heat treatments. Typically, the oxide also may include a number of different phases, only some of which have the desired phase structure of the desired final product; and even if some fraction of the superconductor precursor powder is super-conducting, the superconducting properties generally will be lost or degraded in the course of subsequent deformation.

The superconductor precursor powder is then packed into the silver tube, and the ends of the tube are closed and sealed. The tube with the powder therein is then subjected to conventional cross-section reducing steps (e.g., extruding, drawing) to form it into a monofilamentary wire, typically having the generally circular cross-section shown in FIG. 1. If the desired end product is a mono-filamentary wire, the wire is typically then rolled to deform it (and more particularly the ceramic core) into a non-circular cross-section such as shown in FIG. 2.

If a multi-filamentary wire or tape is desired, a number of single filament wires are bundled together and the bundle is then drawn or extruded, in a generally conventional manner. For example, FIG. 4 illustrates a multi-filamentary wire 10", constructed according to the present invention that includes eight ceramic superconductor filaments 11" encased in a square silver case 12". Each filament 11" is generally rectangular in longitudinal cross-section, i.e., it has a width several times its thickness, and the eight filaments 11" are arranged in two side-by-side stacks, each four filaments high. In each stack, the filaments 11" are arranged so that the long dimension of their cross-section is generally perpendicular to a side of the square case 12". To make a multi-filamentary wire 10" such as that shown in FIG. 4, in which the overall cross-section of the wire (at least before isostatic pressing) is unaspected (i.e., has a height substantially equal to its width) but in which (in cross-section) each filament 11" has a width significantly greater than its thickness (e.g. has an aspect ratio greater than about 1:1 and, preferably, greater than about 5:1), the individual mono-filament wires are first typically rolled to impart a non-circular cross-section to the filaments (e.g., rolled to produce an aspect ratio of greater than 1:1); the desired number of mono-filament wires are then bundled together with silver strips filling the inter-filament spaces, and the multi-filament assembly is then drawn as a unit. In making tape products, the mono-filaments may or may not be rolled before bundling; and the desired overall and filamentary cross-sectional configurations are insured by rolling the multi-filamentary bundle, e.g., by passing it between a pair of closely-spaced rolls.

After tape or wire has been formed into a configuration, e.g., a cross-section, that is essentially the same as or very close to that of the desired end product, it is subjected to the first of a series (generally two, but more may be employed depending on the particular material and processing desired) of heat treatments to react and sinter the superconductor powder precursor. Typically, the first heat treatment results in grain growth and phase transformation of the ceramic superconductor precursor, and produces filaments that are superconducting and have a phase structure closely approximating that of the end product. However, the grain orientation, density, and porosity of the ceramic superconducting material after the initial heat treatment(s) is such that the superconducting properties, e.g., the critical current density, of the superconducting ceramic oxide filaments are lower than desired.

After the first heat treatment(s), the wire or tape is subjected to further deformations, to improve the density and texturing of the superconductor material and conform the tape or wire with its desired end-product configuration, and is also subjected to a final heat treatment. After the final heat treatment the single or multiple filaments of the tape or wire have the desired end-product superconducting properties.

Conventionally, the final deformation/densification has been performed by rolling. It has been found, however, that the superconducting filaments or cores of wires and tapes that have been rolled before the final heat treatment have lower density and critical current than desired. This is thought to be because the rolling causes strain localization or other relative movement of the grains and grain layers, and transverse cracking of the grain structure, that is not entirely cured in the final heat treatment.

Laboratory experiments have showed that the degree of texture and critical current of the superconducting filaments and cores can be increased by uniaxially pressing the wire or tape in a direction perpendicular to its flat dimension, but such pressing is limited to treating short conductor lengths and is thus not suitable for the production of longer conductors.

According to the present invention, the final deformation of the tape or wire (before or concurrently with the final heat treatment) is performed by hot (i.e., greater than about ¾ the melting temperature of the ceramic) or cold (i.e., less than about ¾ the melting temperature) isostatic pressing at a pressure greater than the yield point of both the ceramic material and the noble metal sheath, and typically at a pressure in the range of about 30,000 psi to about 300,000 psi. As previously indicated, it is desirable that filaments of the tape or wire being isostatically pressed have an oblong or rectangular, rather than circular, cross-section. Such a cross-section conventionally results from most tape manufacture, and may be imparted to circular wire by rolling or by drawing or extruding through an appropriately shaped die. In the case of a filamentary structure, an aspect ratio (width:thickness) of not less than about 10:1 is desirable.

Isostatic pressing textures and densifies the superconducting oxide filaments without causing any strain localization or other significant change (other than a tell-tale depression/ridge pattern as discussed hereinafter) in the overall configuration of the tape or wire. For example, in FIG. 4 it will be noted that the portions of the surface of the silver case 12" over filaments 11" are slightly depressed, and that the outer surface of the case includes longitudinally extending ridges 15" between the filament stacks. These ridges are characteristic of a superconducting wire that has been isostatically pressed before its final heat treatment. Before isostatic pressing, the top and bottom of case 12" were flat, as indicated by the dashed lines.

Figure 5A:
FIGS. 5A and 5B are photomicrographs comparing a multifilimentary tape made according to the present invention with one made using more conventional processing.
Figure 5B:

Similarly, FIG. 5 illustrates the cross-section of a nineteen filament tape before isostatic pressing, sample A, and a sample, Sample B, from the same tape after cold isostatic pressing at a pressure of 120,000 psi. The widths of the two samples are substantially the same. It will be seen, however, that the net thickness of regions around the filaments of the cold isostatically pressed sample is less, and that the difference in thickness is substantially all due to a reduction in cross-sectional area (and accompanying increase in texture and density) of the superconducting filaments 11. It will also be seen that, characteristically, the outer-surface of the sample A that has not been isostatically pressed has upwardly projecting ridges 15 overlying at least some of the filaments. This is conventional for the upper and lower surfaces of rolled samples in which, before the final heat treatment, the portions of the surfaces overlying the ceramic filaments will either be flat or bowed slightly upwardly. By way of contrast, the portions of the outer surface of the isostatically pressed sample B overlying the filaments are slightly depressed. To the extent that the isostatic pressing may cause any micro-cracking of the ceramic superconductor, it is essentially eliminated by the subsequent heat treatment and has no adverse effect on the superconducting properties of the final product. No macro-cracking occurs during the isostatic pressing.

Another advantage of the present invention is that the wire or tape may be wound on a mandrel in a coil shape, or subjected to some other operation to place it in the shape in which it will be used, before it is isostatically pressed and thus does not need to be further shaped after the final heat treatment.

After it has been isostatically pressed, the wire or tape is then subjected to a second treatment, again in the conventional manner. As in conventional multi-heat treatment processing of ceramic oxide superconductors, this final heat treatment (which, depending on the particular superconducting material may be under somewhat different conditions than the first heat treatment) results in some phase transformation and grain growth of the product and improves the overall superconducting properties of the filaments by, among other things, establishing good intergranular connectivity for transport conductivity.

It has been found that the superconductor wires and tapes produced according to the present invention i.e., that are isostatically pressed before or concurrently with the final heat treatment, have a significantly greater texture and critical current density ($J_c$) than do those that were rolled before the last heat treatment. Surprisingly, the $J_c$ of superconductors of the present invention approaches that of materials that were pressed, rather than rolled, before the final heat treatment; but, unlike pressing, the present invention is suited to large-scale production and can be used to produce superconducting wires and tapes of practical length.

EXAMPLE I

A superconductor precursor material was prepared by thoroughly mixing bismuth oxide, lead oxide, strontium oxide, calcium oxide and cupric oxide in the relative stoichiometric quantities amounts necessary to produce the desired three-layer, high-$T_c$, bismuth-based superconductor (nominal stoichiometry $Bi_{1.8}Pb_{0.3}Sr_{1.9}Ca_{2.0}Cu_{3.1}O_x$). The mixture was heated at about 800° C. for 10 hours in air to produce a complex powder having the desired overall nominal composition. The phase structure of the resulting powder was not homogeneous; at most only a relatively small amount of the powder had the 2223 phase structure of the desired end product. The majority (over 50%) was 2212 Bi—Sr—Ca—Cu—O material, but alkaline earth bismuthates, plumbates and cuprates and CuO were also present.

Twenty-five grams of the superconductor precursor were then sealed in a silver tube, 0.625 in. outer diameter, 0.325 in. inner diameter (0.150 in. wall thickness), and 5.5 inches long.

The sealed tube was then extruded and drawn through a series of dies of progressively smaller diameter to produce a wire, generally hexagonal in cross-section, having a diameter (e.g., distance between flats) of about 0.070 inches. This wire was then cut into 18 inch lengths, and nineteen of the lengths were bundled together to form a multi-filamentary structure, which in turn was repeatedly drawn into a round wire 0.070 in. in diameter and was then rolled to form a multi-filamentary tape approximately 0.009 inches thick. As shown in FIG. 6, the tape 10A includes nineteen superconductor precursor filaments, designated 11A in a matrix 12 of silver. Tape 10A is 9 mil (0.009 inch) thick and about 0.100 inches wide.

The tape of FIG. 6 was cut into three one-inch long samples. The cross-section of the original complete tape, and of one of the samples, is as shown with respect to tape 10A. The other two samples, which illustrate the result of further deformation, are designated 10B and 10C. After all three samples were submitted to a first heat treatment (in 7½% oxygen for 48 hours at a temperature in the range of about 810 to 830 degrees C.) sample 10B was pressed between two plates at a pressure of about 1 GPa, and sample 10C was cold isostatically pressed at a pressure of 120,000 psi. FIG. 6 shows sample 10B after pressing, and sample 10C after cold isostatic pressing.

It will be seen from FIG. 5 that the cross-sections of the rolled sample 5A, and rolled and isostatically pressed sample 5C, are substantially the same and; as with the samples of FIG. 4, the rolled sample 5A has characteristic depressions in the portion of the tape outer surface overlying the filaments By way of contrast, the cross-section of the tape is significantly changed by pressing. In pressing, the side edges of the tape are unconstrained and, as shown by sample 10B, the result of pressing is a considerable increase in the width, accompanied by a significant decrease in thickness of the tape.

All three samples were then again heat treated. After the second heat treatment, the critical current densities ($J_c$) of the three samples, at 77K, O Tesla field, were as follows:

| Sample | Jc |
| --- | --- |
| 10A | 4,000 A/cm$^2$ |
| 10B | 9,000 A/cm$^2$ |
| 10C | 8,000 A/cm$^2$ |

EXAMPLE II

Single filament wire including a superconductor core of Bi—Sr—Ca—Cu—O, doped with Pb to provide an overall nominal composition of $Bi_{1.8}Pb_{0.3}Sr_{1.9}Ca_{2.0}Cu_{3.1}O_x$, and a silver sheath was made using the same general procedure as in Example 1. The heat treatment conditions varied slightly from those used in Example 1 and the resulting superconductor precursor powder had a different phase structure. The wire was cut into eighteen inch lengths, rebundled to form a nineteen filament conductor, and drawn and rolled into a tape about 0.009 inches thick and about 0.100 in. wide. As with Example I, samples cut from the tape were subjected to a first heat treatment and some of the samples were then flat pressed or cold isostatic pressed. After a second heat treatment, the current densities ($J_c$ at 77K, O Tesla) of 1 inch samples of the rolled (before the first heat treatment), pressed, and isostatically-pressed tape were as follows:

| Sample | $J_c$ |
| --- | --- |
| rolled | 3,000 A/cm$^2$ |
| pressed | 12,000 A/cm$^2$ |
| cipped | 8,000 A/cm$^2$ |

EXAMPLE III

Seven filament conductors were prepared according to the same general procedure as in Example I, and these samples were rolled to different thicknesses, i.e., 24 mils, 18 mils and 12 mils. Between first and second heat treatments, the samples were cold isostatically pressed at 200,000 psi. The critical current density ($J_c$) of the samples at 77K, O Tesla, were as follows:

| Sample | Jc |
| --- | --- |
| 24 mil | 10,000 A/cm$^2$ |
| 18 mil | 13,000 A/cm$^2$ |
| 12 mil | 16,500 A/cm$^2$ |

EXAMPLE IV

A superconductor precursor may be prepared by forming an alloy of yttrium, barium and copper in the atomic ratio Y:1; Ba:2; Cu:3 and oxidizing the alloy to form $YBa_2Cu_3O_x$ powder. Alternatively, $Y_2Ba_4Cu_7O_y$ may be prepared by forming an alloy in the atomic ratio of Y:2; Ba:4; Cu:7; and then oxidizing the alloy. In either event, the resulting powder is packed into a silver tube and a wire (as shown in FIG. 1) having superconducting precursor core surrounded by a silver sheath is produced by drawing the filled tube. After drawing the wire is heat treated, rolled to produce an elliptical or oblong (rather than a circular) cross-section (as shown in FIG. 2), subjected to a first heat treatment, isostatically pressed, and then subjected to a final heat treatments.

EXAMPLE V

A superconductor precursor may be prepared, generally according to the procedures of Example I, by mixing thallium oxide, calcium oxide, barium oxide and cupric oxide in the relative stoichiometric quantities necessary to form any of the desired thallium-based superconducting oxides (e.g., $Tl_1Ba_2Ca_2Cu_3O_z$), reacting the powder mixture and then packing the reacted powder into a silver tube. The powder filled tube is then drawn to produce a wire having a superconducting precursor core surrounded by a silver sheath. After drawing, the wire is rolled to produce a non-circular filamentary cross-section, heat-treated, and isostatically-pressed. The isostatic-pressing may be at a high temperature so that it and a final heat treatment proceed simultaneously. Alternatively, the wire may be subjected to a final heat treatment after isostatic-pressing.

EXAMPLE VI

Sample nineteen filament tapes were prepared using the same superconductor precursor material as in Example III, but different wire heat treatment conditions. Before the last wire heat treatment, three samples were isostatically-pressed, and three were uniaxially pressed, both at pressures of about 65,000, 125,000 and 160,000 psi. One control sample was rolled; a second control sample was neither pressed nor rolled. The $J_c$ (A/cm$^2$ at 77K. 0 Tesla) and thicknesses (mils) of the samples were as follows:

| Sample | Jc | Thickness |
| --- | --- | --- |
| Uni-Press at 65,000 | 10,600 | 5.2 |
| Uni-Press at 125,000 | 9,500 | 6 |
| Uni-Press at 260,000 | 8.900 | 4.8 |
| Iso-Press at 65,000 | 5,400 | 8.4 |
| Iso-Press at 125,000 | 6,400 | 8.5 |
| Iso-Press at 260,000 | 5,300 | 8.7 |
| Rolled Control | 4,300 | 7.5 |
| Second Control | 2,400 | 9 |

It will be noted that, unlike pressing, isostatic pressing has very little effect on the cross-section of the tape.

EXAMPLE VII

Four groups of sample nineteen filament tapes, each about one inch long, were prepared from 2223 Bi—Sr—Ca—Cu—O superconductor precursor powder doped with PbO. Groups I and II contained slightly less Pb than did groups III and IV; and the powder used in the samples of Group I was initially reacted for less than ¼ as long as were the powder used in the other samples. After the tapes were formed, each group was divided into two subsets; the samples (designated "A") from one subset were heat-treated at a slightly (5° C.) higher temperature than were the samples (designated "B") from the other subset; the final heat treatment for all of the samples was the same. Immediately before the final heat treatment, one sample from each subset was isostatically-pressed at about 65,000 psi, a second sample from each subset was pressed at about 500 mPa, and a third was rolled from about: 9 mils to about 8 mils in thickness. As shown below, the $J_c$ (77K, 0 Tesla) of the isostatically-pressed samples was consistently greater than that of the rolled samples and, in all but one instance, only slightly less than that of the pressed sample.

| Sample | $J_c$-IsoPress | $J_c$-Press | $J_c$Rolled |
| --- | --- | --- | --- |
| IA | 10,100 | 12,000 | 4,850 |
| B | 10,200 | 12,500 | 4,050 |
| IIA | 7,650 | 12,500 | 5,650 |
| B | 8,950 | 12,100 | 5,550 |
| IIIA | 7,450 | 11,250 | 5,250 |
| B | 7,700 | 10,000 | — |
| IVA | 9,850 | 11,400 | 3,680 |
| B | 9,000 | 9,900 | 3,680 |

EXAMPLE VIII

Two four meter long, nineteen filament tapes were prepared generally according to the process of Example I. Each tape was rolled to an initial thickness of 0.009 in., and then subjected to the same first heat treatment. After the first heat treatment, one of the tapes was rolled to a thickness of 0.008 inches; the other was isostatically pressed at 65,000 psi. Both tapes were then subjected to identical second heat treatments.

Over the entire approximately 4 meter length, the $J_c$ (again at 77K, 0 Tesla) of the rolled tape was approximately 2,700 A/cm$^2$, that of the isostatically pressed tape was approximately 5,500 A/cm$^2$.

To determine the uniformity along the tape length, one centimeter long samples were cut from various locations along the length of the 4 meter tapes, and the $J_c$ (77K, 0 Tesla) of the short samples measured. The average $J_c$ of the samples from the isostatically pressed tape was 5,850 A/cm$^2$ (77K, 0 Tesla); that of samples from the rolled tape was 3,580. Additionally, the standard deviation of the isostatically pressed samples (17.9%) was significantly smaller than that of the rolled tape samples (42.5%).

EXAMPLE IX

A superconductor precursor may be prepared by mixing yttrium, barium and copper metal powders in the relative quantities corresponding to the atomic ratio Y:1; Ba:2; Cu:3, and packing the powder into a silver tube. The tube is then mechanically deformed into a wire (generally having a circular cross section as shown in FIG. 1), and the wire is heat treated to oxidize the powder in the tube and form superconducting phases, rolled to produce an elliptical or oblong (rather than a circular) cross-section (as shown in FIG. 2), subjected to a plurality of heat treatments and deformations, isostatically pressed, and then subjected to a final heat treatment.

Other embodiments will be within the scope of the following claims.

What is claimed is:

1. A multi-filamentary superconducting conductor comprising a plurality of longitudinally extending oxide superconductor filaments within a ductile metal sheath, the outer surface of said conductor including a plurality of longitudinally-extending depressions, each of said depressions overlying a said longitudinally-extending filament.

2. The multifilimentary conductor of claim 1 wherein said conductor comprises a tape, said tape and each of said filaments having an aspect ratio of not less than about 5:1.

3. The multifilimentary conductor of claim 1 wherein said conductor in cross-section has substantially equal height and width, and said filaments each have an aspect ratio greater than 1:1 and extend generally perpendicular to a side of said conductor.

4. A superconducting conductor of the type including a longitudinally-extending ceramic superconducting oxide core within a ductile metal sheath, said conductor produced by a process that includes the steps of:

providing a said sheath containing a powder of a superconductor precursor having the nominal composition of the superconducting oxide, deforming said sheath with said powder therein to reduce the cross-section thereof to substantially the cross-section of said conductor, and thereafter subjecting said sheath and powder to a plurality of heat treatments to convert said powder into said superconducting oxide core by causing phase conversion and grain growth in the superconducting precursor, the improvement wherein:

after said sheath has been deformed to reduce the cross section thereof to substantially said cross-section of said conductor, and after all except the last of said plurality of said heat treatments, said sheath and core are isostatically pressed to texture and densify said core.

5. A multi-filamentary conductor produced by a process including the steps of bundling a plurality of wires, each of which comprises a superconducting precursor core within a sheath of ductile metal to form a multi-filamentary structure, and deforming said multi-filamentary structure to form said conductor, and wherein said multi-filamentary structure is subjected to said plurality of heat-treatments and is isostatically pressed after all except the last of said plurality of heat treatments.

6. A multi-filamentary conductor having a plurality of filaments, each having in transverse cross-section an aspect ratio greater than 1:1, said conductor being characterized by depressions in portions of an outer surface surrounding said filaments.

* * * * *